United States Patent
Takai et al.

(10) Patent No.: US 11,795,347 B2
(45) Date of Patent: *Oct. 24, 2023

(54) POLISHING SLURRY AND METHOD OF MANUFACTURING SEMICONDUCTOR DEVICE

(71) Applicant: SAMSUNG ELECTRONICS CO., LTD., Suwon-si (KR)

(72) Inventors: Kenji Takai, Hwaseong-si (KR); Eigo Miyazaki, Hwaseong-si (KR); Do Yoon Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/676,928

(22) Filed: Feb. 22, 2022

(65) Prior Publication Data

US 2022/0177728 A1 Jun. 9, 2022

Related U.S. Application Data

(63) Continuation of application No. 16/750,060, filed on Jan. 23, 2020, now Pat. No. 11,254,840.

(30) Foreign Application Priority Data

Mar. 13, 2019 (KR) .................... 10-2019-0028738

(51) Int. Cl.
   C09G 1/02 (2006.01)
   H01L 21/321 (2006.01)
   H01L 21/768 (2006.01)

(52) U.S. Cl.
   CPC .......... *C09G 1/02* (2013.01); *H01L 21/3212* (2013.01); *H01L 21/7684* (2013.01);
   (Continued)

(58) Field of Classification Search
   CPC . C09G 1/02; H01L 21/3212; H01L 21/76877; H01L 21/7684; H01L 21/76843; H01L 21/76834
   See application file for complete search history.

(56) References Cited

U.S. PATENT DOCUMENTS 3,830,773 A   8/1974   Barkey et al.
6,083,419 A   7/2000   Grumbine et al.
(Continued)

FOREIGN PATENT DOCUMENTS

CN   104513628 A    4/2015
EP   0932913 A1    12/1996
(Continued)

OTHER PUBLICATIONS

English Abstract of JP 2008024523.
(Continued)

*Primary Examiner* — Robert G Bachner
(74) *Attorney, Agent, or Firm* — CANTOR COLBURN LLP (57) ABSTRACT

A polishing slurry including a hydrophilic nanocarbon particle having a nitrogen-containing functional group, and a weight ratio of a nitrogen element relative to a carbon element of the hydrophilic nanocarbon particle, the weight ratio expressed as N/C×100% is greater than or equal to about 5 wt %, and a method of manufacturing a semiconductor device using the polishing slurry.

20 Claims, 4 Drawing Sheets

(52) U.S. Cl.
CPC .. *H01L 21/76834* (2013.01); *H01L 21/76843* (2013.01); *H01L 21/76877* (2013.01)

(56) References Cited

U.S. PATENT DOCUMENTS

| | | | |
|---|---|---|---|
| 6,136,711 | A | 10/2000 | Grumbine et al. |
| 6,585,568 | B2 | 7/2003 | Tsuchiya et al. |
| 6,750,128 | B2 | 6/2004 | Kondo |
| 6,776,810 | B1 | 8/2004 | Cherian et al. |
| 7,247,946 | B2 | 7/2007 | Bruley et al. |
| 7,300,958 | B2 | 11/2007 | Kataoka et al. |
| 7,306,637 | B2 | 12/2007 | Cherian et al. |
| 7,404,831 | B2 | 7/2008 | Hongjun et al. |
| 7,754,054 | B2 | 7/2010 | Mitra et al. |
| 7,900,855 | B2 | 3/2011 | Asahi et al. |
| 8,083,964 | B2 | 12/2011 | Yamada et al. |
| 9,202,709 | B2 | 12/2015 | Tomiga et al. |
| 9,978,609 | B2 | 5/2018 | Shi et al. |
| 11,254,840 | B2 * | 2/2022 | Takai ............... H01L 21/3212 |
| 2003/0153457 | A1 | 8/2003 | Nemoto et al. |
| 2004/0171264 | A1 | 9/2004 | Kondo et al. |
| 2005/0136079 | A1 | 6/2005 | Burangulov et al. |
| 2006/0157671 | A1 | 7/2006 | Park et al. |
| 2007/0232068 | A1 | 10/2007 | Minamihaba et al. |
| 2007/0293049 | A1 | 12/2007 | Minamihaba et al. |
| 2008/0184914 | A1 | 8/2008 | Shen et al. |
| 2010/0015083 | A1 | 1/2010 | Takada et al. |
| 2011/0039475 | A1 | 2/2011 | Hoshi et al. |
| 2012/0270400 | A1 | 10/2012 | Takegoshi et al. |
| 2017/0033357 | A1 | 2/2017 | Cho et al. |
| 2017/0190936 | A1 | 7/2017 | Dockery et al. |
| 2019/0100678 | A1 | 4/2019 | Zhou et al. |

FOREIGN PATENT DOCUMENTS

| | | | |
|---|---|---|---|
| EP | 1894973 | A1 | 3/2008 |
| EP | 2662885 | A1 | 11/2013 |
| EP | 3495439 | A1 | 6/2019 |
| EP | 3792321 | A1 | 3/2021 |
| JP | 2000510289 | A | 8/2000 |
| JP | 2001332516 | A | 11/2001 |
| JP | 2002050595 | A | 2/2002 |
| JP | 2004050297 | A | 2/2002 |
| JP | 2004311967 | A | 11/2004 |
| JP | 200535809 | A | 2/2005 |
| JP | 2005136433 | A | 5/2005 |
| JP | 2005146036 | | 6/2005 |
| JP | 2005223278 | A | 8/2005 |
| JP | 2005320475 | A | 11/2005 |
| JP | 200669812 | A | 3/2006 |
| JP | 2006203197 | A | 8/2006 |
| JP | 2007266500 | A | 10/2007 |
| JP | 20084621 | A | 1/2008 |
| JP | 2008024523 | A | 2/2008 |
| JP | 2008277723 | A | 11/2008 |
| JP | 2009065207 | A | 3/2009 |
| JP | 200988182 | A | 4/2009 |
| JP | 2009260304 | A | 11/2009 |
| JP | 2010206212 | A | 9/2010 |
| JP | 5250433 | B2 | 7/2013 |
| JP | 5442892 | B2 | 3/2014 |
| JP | 2015013325 | A | 1/2015 |
| JP | 2016098354 | A | 5/2016 |
| JP | 2016196632 | A | 11/2016 |
| JP | 2016208005 | A | 12/2016 |
| JP | 6276315 | B2 | 2/2018 |
| JP | 2018090682 | A | 6/2018 |
| KR | 10-2004-0088070 | A | 10/2004 |
| KR | 100497413 | B1 | 6/2005 |
| KR | 1293790 | B1 | 7/2012 |
| KR | 101189206 | B1 | 10/2012 |
| KR | 10-2015-0077541 | A | 7/2015 |
| KR | 10-2016-0024465 | A | 3/2016 |
| KR | 20160024465 | A | 3/2016 |
| KR | 1833219 | B1 | 2/2018 |
| KR | 10-2018-0064019 | A | 6/2018 |
| KR | 20180061952 | A | 6/2018 |
| WO | 9905706 | A1 | 2/1999 |
| WO | 2006028297 | A1 | 9/2005 |
| WO | 2005109480 | A1 | 11/2005 |
| WO | 2007020939 | A1 | 2/2007 |
| WO | 2008096763 | A1 | 8/2008 |

OTHER PUBLICATIONS

Chandramouli Subramaniam, et al., "One hundred fold increase in current carrying capacity in a carbon nanotube-copper composite", | Accepted Jun. 26, 2013 | Published Jul. 23, 2013, Nature Communications, 4, 2202 (2013).

Chandramouli Subramaniam, et al., One hundred fold increase in current carrying capacity in a carbon nanotube-copper composite, Nature Communications, 42202, 2013, 1-7.

English Abstract of JP 2005-146036.

English Abstract of JP 2005-35809.

English Abstract of JP 2006-69812.

Extended European Search Report dated Apr. 8, 2021, issued in EP Patent Application No. 20200253.1, 6 pp.

Extended European Search Report dated Nov. 20, 2020, of the corresponding European Patent Application No. 20175744.0.

H.W. Kroto, et al., Nature vol. 318, 162-163 (Nov. 14, 1985).

Ken Kokubo, et al., vol. 2 , No. 2, 327-333, 2008, ACNANO, Facile Synthesis of Highly Water-Soluble Fullerenes More Than Half-Covered by Hydroxyl Groups.

Kenji Matsubayashi, et al., (2009) One-step Synthesis of Water-soluble Fullerenols Bearing Nitrogen-containing Substituents, Fullerenes, Nanotubes and Carbon Nanostructures, 17:4, 440-456, DOI: 10.1080/01490450903039263.

Machine English Translation of JP 2005-35809.

Machine English Translation of JP 2006-69812.

Machine English Translation of JP 2008024523.

Y. Takaya, et al., "Performance of Water-Soluble Fullerenol as Novel Functional Molecular Abrasive Grain for Polishing Nanosurfaces", CIRP Annals—Manufacturing Technology, vol. 58, pp. 495-498. (Year: 2009).

Yasuhiro Takaya, et al., Surface analysis of the chemical polishing process using a fullerenol slurry by Raman spectroscopy under surface plasmon excitation, CIRP Annals—Manufacturing Technology 62 (2013) 571-574.

* cited by examiner

POLISHING SLURRY AND METHOD OF MANUFACTURING SEMICONDUCTOR DEVICE

This is a continuation application of U.S. application Ser. No. 16/750,060, filed Jan. 23, 2020, now U.S. Pat. No. 11,254,840, which in turn claims priority to Korean Patent Application No. 10-2019-0028738 filed in the Korean Intellectual Property Office on Mar. 13, 2019, and all the benefits accruing therefrom under 35 U.S.C. 119,120, contents of which in their entirety are herein incorporated by reference.

BACKGROUND

1. Field

A polishing slurry and a method of manufacturing a semiconductor device.

2. Description of the Related Art

A semiconductor device includes a structure having a planar surface during the manufacturing process, and the structure may be obtained by a polishing process. One example of the polishing process may be a chemical mechanical polishing (CMP). Chemical mechanical polishing is a process including providing a polishing slurry between a substrate to be polished and a polishing pad and contacting the surface of the semiconductor substrate with the polishing pad, and using the polishing pad to planarize the surface of the semiconductor substrate by applying pressure and rotating the polishing pad and/or the semiconductor substrate.

A high performance and highly integrated semiconductor device includes a structure having a fine pitch of less than or equal to about 10 nm, so there exists a need to develop a polishing slurry in the making of such a semiconductor device with a fine pitch structure.

SUMMARY

An embodiment provides a polishing slurry capable of improving a polishing rate, while decreasing damage and/or shape deformation to a structure during polishing.

Another embodiment provides a method of manufacturing a semiconductor device using the polishing slurry.

According to an embodiment, a polishing slurry includes a hydrophilic nanocarbon particle having a nitrogen-containing functional group, wherein a weight ratio of a nitrogen element relative to a carbon element of the hydrophilic nanocarbon particle expressed as N/C×100% is greater than or equal to about 5 wt %.

The weight ratio of a nitrogen element relative to a carbon element of the hydrophilic nanocarbon particle may be about 5 wt % to about 80 wt %.

The nitrogen-containing functional group may be derived from at least one of ammonia, an ammonium salt, an amine compound, a polyamine compound, a nitro compound, an azo compound, hydroxides of each thereof, or hydrates of each thereof.

The nitrogen-containing functional group may include at least one of an amino group, a nitro group, a secondary amine group, a tertiary amine group, a quaternary amine group, a diamine group, a polyamine group, an azo group, or an amide group.

The hydrophilic nanocarbon particle may include at least one of fullerene, graphene, graphite, a carbon nanotube, or a carbon dot, each of which including at least one hydrophilic functional group.

The hydrophilic functional group may include at least one of a hydroxyl group, a carbonyl group, a carboxyl group, a sulfhydryl group, or a phosphate group.

The hydrophilic nanocarbon particle may have at least one hydrophilic functional group and the hydrophilic nanocarbon particle may include on average 12 to 44 of the hydrophilic functional groups and the nitrogen-containing functional groups.

The nitrogen-containing functional group may exist in a greater number of groups than the hydrophilic functional group.

The hydrophilic nanocarbon particle may further include a metal ion chemically fixed on the surface of the hydrophilic nanocarbon particle.

The metal ion may be derived from a soluble metal compound.

The hydrophilic nanocarbon particle may include hydroxyl fullerene.

The polishing slurry may further include an oxidizing agent, a chelating agent, a surfactant, a dispersing agent, or a combination thereof.

According to another embodiment, a polishing slurry includes a hydrophilic nanocarbon particle on which an oxidation catalyst is chemically fixed.

The oxidation catalyst may include a nitrogen-containing oxidation catalyst.

The nitrogen-containing oxidation catalyst may be derived from at least one of ammonia, an ammonium salt, an amine compound, a polyamine compound, a nitro compound, an azo compound, hydroxides of each thereof, or hydrates of each thereof.

The nitrogen-containing oxidation catalyst may include at least one of an amino group, a nitro group, a secondary amine group, a tertiary amine group, a quaternary amine group, a diamine group, a polyamine group, an azo group, or an amide group.

The oxidation catalyst may further include a metal-containing oxidation catalyst.

The metal-containing oxidation catalyst may be derived from a soluble metal compound.

The hydrophilic nanocarbon particle may include at least one of fullerene, graphene, graphite, a carbon nanotube, or a carbon dot, each of which have at least one hydrophilic functional group.

The hydrophilic functional group may include at least one of a hydroxyl group, a carbonyl group, a carboxyl group, a sulfhydryl group, or a phosphate group.

The hydrophilic nanocarbon particle may have at least one hydrophilic functional group and the hydrophilic nanocarbon particle may include on average 12 to 44 of the hydrophilic functional groups and the nitrogen-containing functional groups.

The oxidation catalyst may exist on average in a greater number than the hydrophilic functional group.

The hydrophilic nanocarbon particle may include hydroxyl fullerene.

The polishing slurry may further include an oxidizing agent, a chelating agent, a surfactant, a dispersing agent, or a combination thereof.

According to another embodiment, a method of manufacturing a semiconductor device using the polishing slurry is provided.

In comparison to a polishing slurry including the conventional silica abrasive, the polishing slurry according to an embodiment may improve a polishing rate, or reduce or minimize damage and shape deformation of a structure during the polishing.

BRIEF DESCRIPTION OF THE DRAWINGS

FIGS. 1 to 4 are cross-sectional views sequentially showing a method of manufacturing a semiconductor device according to an embodiment: wherein

DETAILED DESCRIPTION

Example embodiments will hereinafter be described in detail and may be easily performed by a person having an ordinary skill in the related art. However, this disclosure may be embodied in many different forms and is not to be construed as limited to the example embodiments set forth herein. Rather, these embodiments are provided so that this disclosure will be thorough and complete, and will fully convey the scope of the invention to those skilled in the art. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Hereinafter, a polishing slurry according to an embodiment is described.

The polishing slurry according to an embodiment includes hydrophilic nanocarbon particles on which an oxidation catalyst is chemically fixed.

The hydrophilic nanocarbon particles may be nanocarbon particles having at least one hydrophilic functional group. The nanocarbon particles may be an angstrom- or nanometer-sized high-hardness particle consisting of carbon or including carbon as a main component, and may be for example at least one of fullerene, graphene, graphite, a carbon nanotube, or a carbon dot, but is not limited thereto. The nanocarbon particles may have an average primary particle size of, for example less than or equal to about 10 nanometers (nm), less than or equal to about 8 nm, less than or equal to about 7 nm, less than or equal to about 5 nm, less than or equal to about 3 nm, or less than or equal to about 2 nm, for example about 0.1 nm to about 10 nm, about 0.1 nm to about 8 nm, about 0.1 nm to about 7 nm, about 0.1 nm to about 5 nm, about 0.1 nm to about 3 nm, or about 0.1 nm to about 2 nm.

For example, the nanocarbon particles may be fullerene. The fullerene core may generally be hydrophobic and may have hydrophilicity by being bound to a hydrophilic functional group. The fullerene core may be for example C60, C70, C74, C76, or C78, but is not limited thereto.

The hydrophilic functional group may include for example at least one of a hydroxyl group, a carbonyl group, a carboxyl group, a sulfhydryl group, or a phosphate group, but is not limited thereto. For example, the hydrophilic functional group may be a hydroxyl group.

The hydrophilic nanocarbon particles may include on average one or more hydrophilic functional groups per nanocarbon particle, for example on average greater than or equal to 1 and less than 44 of hydrophilic functional groups bound thereto, on average greater than or equal to 2 and less than 44 of hydrophilic functional groups bound thereto, on average greater than or equal to 3 and less than 44 of hydrophilic functional groups bound thereto, on average greater than or equal to 5 and less than 44 of hydrophilic functional groups bound thereto, on average greater than or equal to 8 and less than 44 of hydrophilic functional groups bound thereto, on average greater than or equal to 10 and less than 44 of hydrophilic functional groups bound thereto, on average greater than or equal to 12 and less than 44 of hydrophilic functional groups bound thereto, on average greater than or equal to 16 and less than 44 of hydrophilic functional groups bound thereto, on average greater than or equal to 20 and less than 44 of hydrophilic functional groups bound thereto, on average greater than or equal to 24 and less than 44 of hydrophilic functional groups bound thereto, on average 24 to 40 hydrophilic functional groups bound thereto, on average 24 to 36 hydrophilic functional groups bound thereto, on average greater than or equal to 28 and less than 44 of hydrophilic functional groups bound thereto, on average 28 to 40 hydrophilic functional groups bound thereto, on average 30 to 38 hydrophilic functional groups bound thereto, or on average 30 to 34 hydrophilic functional groups bound thereto.

For example, the hydrophilic nanocarbon particles may be hydroxyl fullerene.

An oxidation catalyst is chemically fixed on the surface of the hydrophilic nanocarbon particle. For example, the oxidation catalyst may be either chemically bound to the surface of the hydrophilic nanocarbon particle or chemically adsorbed to the surface of the hydrophilic nanocarbon particle.

The oxidation catalyst may be a catalyst that promotes an oxidation reaction. The oxidation catalyst may be supplied in a synthesis of the hydrophilic nanocarbon particles, and it is possible to promote the synthesis of the hydrophilic nanocarbon particles by increasing a decomposition rate of the oxidizing agent such as hydrogen peroxide and simultaneously to increase a polishing rate of the polishing slurry by being fixed to the surface of the hydrophilic nanocarbon particle. The oxidation catalyst may be for example a hydrogen peroxide decomposition catalyst.

The oxidation catalyst may include for example a nitrogen-containing oxidation catalyst.

The nitrogen-containing oxidation catalyst may be bound to the surface of the hydrophilic nanocarbon particles as a nitrogen-containing functional group. The nitrogen-containing oxidation catalyst or the nitrogen-containing functional group may be for example derived from at least one of ammonia, an ammonium salt, an amine compound, a polyamine compound, a nitro compound, an azo compound, hydroxides of each thereof, or hydrates of each thereof and may include for example at least one of an amino group, a nitro group, secondary amine, tertiary amine, quaternary amine, diamine, polyamine, an azo group, or an amide group.

The oxidation catalyst may include for example a metal-containing oxidation catalyst. The metal-containing oxidation catalyst may be derived from a soluble metal compound including a metal ion. The metal ion may be for example at least one of a transition metal ion and Group IIIA/Group IVA metal ions, for example at least one of Fe, Nb, Ni, Os, Pd, Ru, Ti, V, Su, Ag, Co, Cr, Cu, Mo, or Mn, but is not limited thereto. The soluble metal compound may be for example a metal compound that is one of a citrate, an oxalate, an acetate, a tartrate, a nitriloacetic acid, an ethylenediamine tetraacetic acid, a phosphinic acid, a phosphonic acid, a glycolic acid, a lactic acid, a malic acid, a tartaric acid, an α-hydroxycarboxylic acid, a hydroxyamino acid, or a combination thereof, each of which includes the metal ion, but is not limited thereto.

The oxidation catalyst may include for example a nitrogen-containing oxidation catalyst and a metal-containing oxidation catalyst.

The presence and amount of the oxidation catalyst may be confirmed by an elemental analysis. For example, the nitrogen-containing oxidation catalyst or the nitrogen-containing functional group fixed on the surface of the hydrophilic nanocarbon particles may be confirmed from an analysis of nitrogen element and the metal-containing oxidation catalyst fixed on the surface of nanocarbon particles may be confirmed from an analysis of metal elements.

For example, a weight ratio of a nitrogen element relative to a carbon element of the hydrophilic nanocarbon particles may be expressed as N/C×100% and may be greater than or equal to about 5 weight percent (wt %), for example about greater than or equal to about 10 wt %, greater than or equal to about 15 wt %, greater than or equal to about 20 wt %, greater than or equal to about 30 wt %, greater than or equal to about 35 wt %, or greater than or equal to about 40 wt %. Within the ranges, the weight ratio of a nitrogen element relative to a carbon element of the hydrophilic nanocarbon particles expressed as N/C×100% may be for example about 5 wt % to about 80 wt %, about 10 wt % to about 80 wt %, about 15 wt % to about 80 wt %, about 20 wt % to about 80 wt %, about 30 wt % to about 80 wt %, about 35 wt % to about 80 wt %, or about 40 wt % to about 80 wt %.

For example, a weight ratio of a metal element relative to a carbon element of the hydrophilic nanocarbon particles is expressed as Me/C×100%, and may be for example in a range of about 0 to about 80 wt %, and includes the range, about 2 wt % to about 80 wt %, about 5 wt % to about 80 wt %, or about 10 wt % to about 80 wt %.

The oxidation catalyst may be bonded on the surface of the hydrophilic nanocarbon particles, and accordingly, the hydrophilic functional group and the oxidation catalyst may be respectively bonded on the surface of the nanocarbon particle. The total number of the hydrophilic functional group and the oxidation catalyst per one nanocarbon particle may be on average about 12 to about 44.

For example, the number of the oxidation catalyst bonded on the nanocarbon particles may be larger than the number of the hydrophilic functional group, and the number of the oxidation catalyst may be for example on average about 1 to about 44.

For example, the hydrophilic nanocarbon particles may be represented by Chemical Formula 1, but is not limited thereto.

Chemical Formula 1

In Chemical Formula 1,

OC is an oxidation catalyst, for example a nitrogen-containing oxidation catalyst such as at least one of an amino group, a nitro group, a secondary amine group, a tertiary amine group, a quaternary amine group, a diamine group, a polyamine group, an azo group, and an amide group, or a metal-containing oxidation catalyst, x is 60, 70, 74, 76, or 78, y is greater than or equal to 1 and less than 44, z is greater than or equal to 1 and less than 44, and y+z is 12 to 44.

The hydrophilic nanocarbon particles may effectively function as an abrasive in a polishing slurry as a high-hardness particle, the hydrophilic nanocarbon particles may function as an abrasive in polishing slurry, and as the hydrophilic nanocarbon particles have a relatively small particle size of less than or equal to about 10 nanometers (nm) unlike a conventional abrasive such as silica having a particle diameter of tens to hundreds of nanometers, the hydrophilic nanocarbon particles may be effectively applied as an abrasive for a fine-pitched structure having a width of less than or equal to about 10 nm. Thereby, the hydrophilic nanocarbon particles may result in a reduction of damage or deformation such as scratch, dishing, and/or erosion on a polished structure.

In addition, the hydrophilic nanocarbon particles may effectively function as an oxidizing auxiliary agent in the polishing slurry. The oxidation catalyst fixed on the surface of the particle may effectively decompose the oxidizing agent included in the polishing slurry, and thus, effectively polish a polished object such as a metal structure.

The hydrophilic nanocarbon particles may be present as primary particles or agglomerated secondary particle in the polishing slurry. An average primary particle size of the hydrophilic nanocarbon particle may be of less than or equal to about 10 nm, and an average secondary particle size thereof may be in a range of about 2 nm to about 300 nm.

The hydrophilic nanocarbon particles may be for example included in an amount of about 0.001 weight percent (wt %) to about 10 wt %, for example about 0.001 wt % to about 5 wt %, about 0.001 wt % to about 3 wt % or about 0.001 wt % to about 1 wt %, based on a total amount (including a solvent) of the polishing slurry.

The polishing slurry may further include an additional abrasive. The additional abrasive may be for example a metal oxide, a semi-metal oxide, and/or an organic material and may have a particle size of, for example about 20 nm to about 100 nm. The additional abrasive may be for example silica, alumina, germania, titania, ceria, zirconium oxide, a polymer, or a combination thereof, but is not limited thereto.

The polishing slurry may further include an oxidizing agent. The oxidizing agent may be, for example, hydrogen peroxide, a permanganate compound, ammonium persulfate, sodium persulfate, perbenzoic acid, peracetic acid, sodium hydroxide, potassium hydroxide, or a combination thereof, but is not limited thereto. The oxidizing agent may be for example included in an amount of about 0.001 wt % to about 10 wt %, about 0.001 wt % to about 5 wt %, about 0.001 wt % to about 4 wt %, about 0.001 wt % to about 3 wt %, or about 0.001 wt % to about 1 wt %, based on a total amount (including a solvent) of the polishing slurry.

The polishing slurry may further include an additive, and the additive may be for example a chelating agent, a surfactant, a dispersing agent, a pH controlling agent, or a combination thereof, but is not limited thereto.

The chelating agent may be for example oxalic acid, malonic acid, succinic acid, maleic acid, phthalic acid, tartaric acid, aspartic acid, glutamic acid, citric acid, aminocarboxylic acid, phosphoric acid, polyphosphoric acid, nitric acid, phosphonic acid, a salt thereof, or a combination thereof, but is not limited thereto.

The surfactant may be an ionic or non-ionic surfactant, for example a copolymer of ethylene oxide, a copolymer of propylene oxide, an amine compound, or a combination thereof, but is not limited thereto.

The dispersing agent may be optionally included to promote uniform dispersion of the aforementioned hydrophilic nanocarbon particles and to increase polishing efficiency or polishing rate, and may be for example poly(meth)acrylic acid, poly(meth)acryl maleic acid, polyacrylonitrile-co-butadiene-acrylic acid, carboxylic acid, sulfonic ester, sulfonic acid, phosphoric ester, cellulose, diol, a salt thereof, or a combination thereof, but is not limited thereto.

The pH controlling agent may control pH of the polishing slurry and may be for example inorganic acid, organic acid, a salt thereof, or a combination thereof. The inorganic acid may include for example nitric acid, hydrochloric acid, phosphoric acid, sulfuric acid, hydrofluoric acid, bromic acid, iodic acid or a salt thereof, the organic acid may include for example formic acid, malonic acid, maleic acid, oxalic acid, adipic acid, citric acid, acetic acid, propionic acid, fumaric acid, lactic acid, salicylic acid, benzoic acid, succinic acid, phthalic acid, butyric acid, glutaric acid, glutamic acid, glycolic acid, lactic acid, aspartic acid, tartaric acid, or a salt thereof, but is not limited thereto.

Each additive may be independently for example included in a trace amount of about 1 part per million (ppm) to about 100,000 ppm, but is not limited thereto.

The polishing slurry may further include a solvent capable of dissolving or dispersing (suspending) the above components, and the solvent may be for example water. The water may be for example distilled water and/or deionized water.

Hereinafter, a method of manufacturing the aforementioned polishing slurry is described.

The polishing slurry according to an embodiment may be obtained by a one-pot synthesis method.

A method of manufacturing the polishing slurry according to an embodiment may include adding nanocarbon particles, an oxidation catalyst or a precursor thereof, and an oxidizing agent to a mixed solvent of an organic solvent and water, and heat-treating the mixture to form hydrophilic nanocarbon particles on which an oxidation catalyst is chemically fixed.

First, a mixed solvent of an organic solvent and water is prepared in one container. The organic solvent may be for example toluene, benzene, 1-methylnaphthalene, 1,2,4-trimethylbenzene, p-xylene, or a combination thereof, and the water may be for example distilled water and/or deionized water. The organic solvent and the water may be mixed at a volume ratio of about 10:90 to about 90:10, for example, at a volume ratio of about 20:80 to about 80:20, about 30:70 to about 70:30, about 40:60 to about 60:40, or about 50:50. The organic solvent and the water have different polarity from each other, so the mixed solvent may exhibit phase-separation into an organic phase including the organic solvent and an aqueous phase including water.

Subsequently, the nanocarbon particles, the oxidation catalyst or the precursor thereof, and the oxidizing agent are added to the mixed solvent. The nanocarbon particles, the oxidation catalyst or the precursor thereof, and the oxidizing agent may be simultaneously added or the nanocarbon particles may be first added and dispersed, and then the oxidation catalyst or the precursor thereof and the oxidizing agent may be added thereto.

The nanocarbon particles may be for example at least one of fullerene, graphene, graphite, a carbon nanotube, or a carbon dot, or may be for example fullerene. The fullerene may be for example C60, C70, C74, C76, or C78, but is not limited thereto.

The oxidation catalyst or the precursor thereof may be a nitrogen-containing oxidation catalyst and/or a metal-containing oxidation catalyst as described above. A precursor of the nitrogen-containing oxidation catalyst may be for example at least one of ammonia, an ammonium salt, an amine compound, a polyamine compound, a nitro compound, an azo compound, hydroxides of each thereof, or hydrates of each thereof, and the oxidation catalyst may include for example at least one of an amino group, a nitro group, secondary amine, tertiary amine, quaternary amine, diamine, polyamine, an azo group, or an amide group, which are derived from the precursors. A precursor of the metal-containing oxidation catalyst may be for example a soluble metal compound including at least one metal of Fe, Nb, Ni, Os, Pd, Ru, Ti, V, Su, Ag, Co, Cr, Cu, Mo, or Mn.

The oxidizing agent may be for example hydrogen peroxide, a permanganate compound, ammonium persulfate, sodium persulfate, perbenzoic acid, peracetic acid, sodium hydroxide, potassium hydroxide, or a combination thereof, but is not limited thereto.

Nanocarbon particles such as fullerene may be dispersed in the organic phase and low-value, and hydrophilic nanocarbon particles may form hydrophilic groups such as hydroxyl groups present in the organic phase. The low-value hydrophilic nanocarbon particles means nanocarbon particles having a small number of hydrophilic groups and may be for example fullerene having about one to ten hydrophilic groups, for example hydrophilic nanocarbon particles represented by a mixture of particles $C_x(OH)_y$ (wherein, x is 60, 70, 74, 76, or 78 and y is 1 to 10). Of course, a person of skill in the art would understand that this mixture of low-value hydrophilic nanocarbon particles may have a few outlier particles with for example y greater than 10.

Subsequently, the aforementioned mixture is subjected to heat-treatment. The heat-treatment may be for example performed at about 25° C. to about 90° C., for example for about 2 hours to about 100 hours. By heat-treatment, the low-value hydrophilic nanocarbon particles may be transferred to the aqueous phase and in the aqueous phase, the low-value hydrophilic nanocarbon particles may react with an oxidizing agent such as hydrogen peroxide to form a high-value hydrophilic nanocarbon particle. Herein, the high-value hydrophilic nanocarbon particles mean fullerene having a relatively large number of hydrophilic groups. The high-value hydrophilic nanocarbon particles may be for example nanocarbon particles having greater than or equal to about 32 and less than about 44 of hydrophilic groups and may be for example a mixture of hydrophilic nanocarbon particles represented by $C_x(OH)_y$ (wherein, x is 60, 70, 74, 76, or 78, and y is 32 to 44). Likewise, a person of ordinary skill would recognize there may exist a few high-value hydrophilic nanocarbon particles outliers with y values less than 32 or greater than 44. The high-value hydrophilic nanocarbon particles may exist in the anionic state in the aqueous phase and may be in pair with the oxidation catalyst present in the aqueous phase to form a chemically fixed hydrophilic nanocarbon particle. A hydrophilic group, such as a hydroxyl group, may be converted to another hydrophilic group by reaction with the oxidation catalyst or the precursor thereof. For example, some of the hydroxyl groups may be converted to amino groups.

The hydrophilic nanocarbon particles on which the oxidation catalyst is chemically fixed may be dispersed in the aqueous phase, that is water, and an organic solvent that is the organic phase may be removed after forming the hydrophilic nanocarbon particles on which an oxidation catalyst is chemically fixed.

The aforementioned polishing slurry may be used for providing the various structures, for example, the slurry may be applied for a polishing process of a conductor such as a metal wire or a polishing process of an insulator such as an insulation layer or a shallow trench isolation (STI). The metal wire may be a Cu wire, a W wire, a Ru wire, or a combination thereof, but is not limited thereto.

Hereinafter, an example of a method of manufacturing a semiconductor device using the polishing slurry is described.

FIGS. 1 to 4 are cross-sectional views sequentially showing a method of manufacturing a semiconductor device according to an embodiment.

Figure 1:
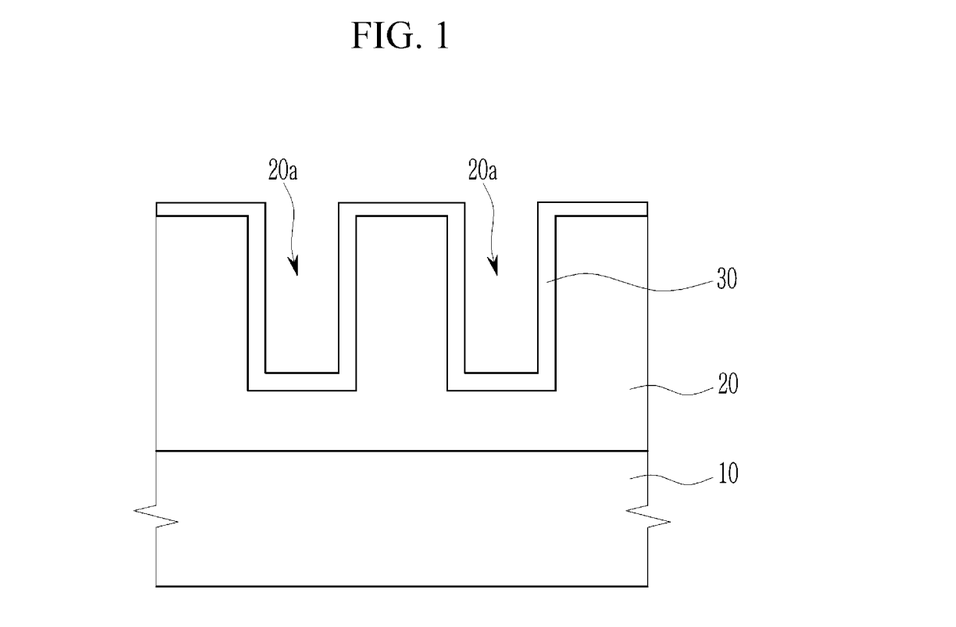
FIG. 1 represents an insulation layer on a substrate with trenches formed in the insulation layer, and a conductive layer formed on the walls and floor of the trenches.

Referring to FIG. 1, an interlayer insulating layer 20 is formed on the semiconductor substrate 10. The interlayer insulating layer 20 may include an oxide, a nitride, and/or an oxynitride. Subsequently, the interlayer insulating layer 20 is etched to provide a trench 20a. The trench 20a may have a width of less than or equal to about 10 nm. Subsequently, a barrier layer 30 is formed on the wall surface of the trench. The barrier layer 30 may include, for example, Ta and/or TaN, but is not limited thereto.

Figure 2:
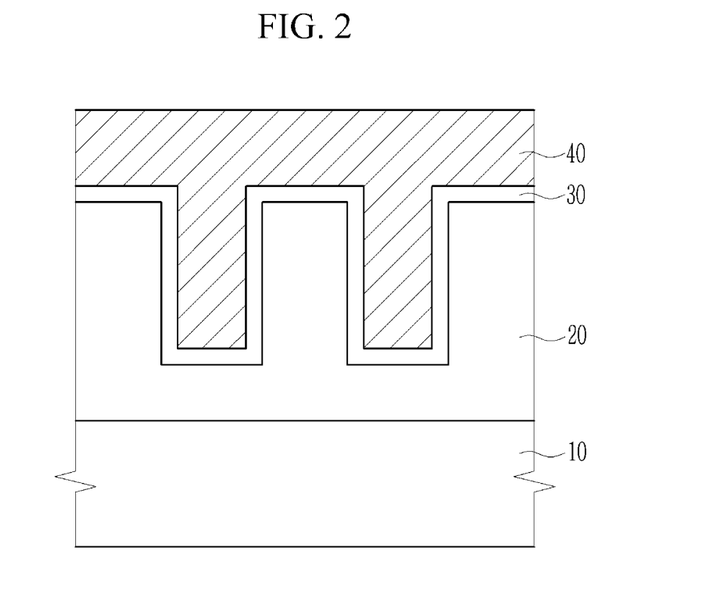
FIG. 2 represents a metal layer of an embodiment formed on the conductive layer of FIG. 1.

Referring to FIG. 2, a metal such as copper (Cu), tungsten (W), and/or ruthenium (Ru) is filled in the inside of the trench to provide a metal layer 40.

Figure 3:
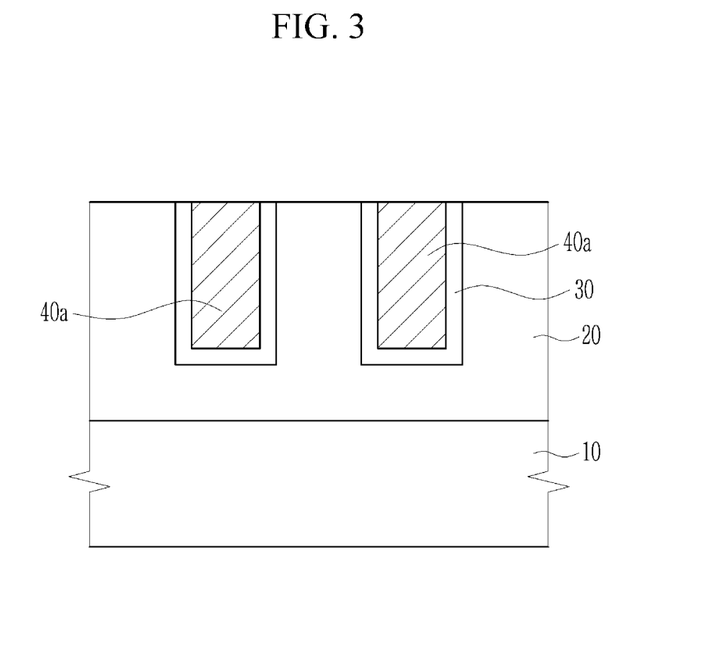
FIG. 3 represents a metal structure of an embodiment that is planarized to coincide with a surface of the insulation layer.

Referring to FIG. 3, a surface of the metal layer 40 is planarized to be corresponded to the surface of the interlayer insulating layer 20 and forms a filled metal layer 40a. The planarization may be performed by chemical mechanical polishing (CMP) and may use the aforementioned polishing slurry. For example, when the barrier layer 30 is a Ta layer, and the metal layer 40 is a Cu layer, a W layer, and/or a Ru layer, the aforementioned polishing slurry exhibits improved polishing selectivity of Ta to Cu, Ta to W, or Ta to Ru, for example, as the polishing slurry may exhibit a polishing selectivity of greater than 40:1 or about 50:1.

Figure 4:
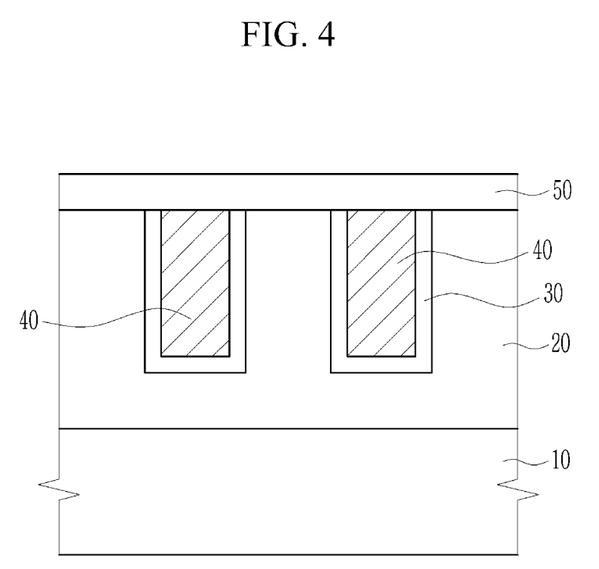
FIG. 4 represents a metal structure of an embodiment with a capping layer.

Referring to FIG. 4, a capping layer 50 is formed on the filled metal layer 40 and the interlayer insulating layer 20. The capping layer 50 may include SiN and/or SiC but is not limited thereto.

As described above, the method of manufacturing a semiconductor device according to an embodiment has been described, but it is not limited thereto, and it may be employed for a semiconductor device having the various structures.

Hereinafter, the embodiments are illustrated in more detail with reference to examples. However, these examples are exemplary, and the present disclosure is not limited thereto.

Synthesis Example of Hydrophilic Nanocarbon Particle

Synthesis Example 1

3 grams (g) of Nanom spectra D100 (Frontier Carbon Corp.) including a hydroxyl fullerene ($C_{60}(OH)_{10}$) having in average 10 hydroxy groups as a main component, 300 milliliters (ml) of a 30 wt % hydrogen peroxide solution (Fuji Film Wako Pure Chemical Corp.), and 120 ml of 28 wt % ammonia water are put in a 500 ml flask and then, reacted at 60° C. for 10 hours. After the reaction, 1 Liter (L) of isopropyl alcohol, 1 L of diethyl ether, and 1 L of hexane are sequentially added thereto to extract a brown precipitate. Subsequently, the precipitate is filtered, washed, and dried under a reduced pressure to obtain hydrophilic nanocarbon particles.

Synthesis Example 2

Hydrophilic nanocarbon particles are obtained according to the same method as Synthesis Example 1 except that the reaction is performed at 60° C. for 30 hours instead of the 10 hours.

Synthesis Example 3

Hydrophilic nanocarbon particles are obtained according to the same method as Synthesis Example 1 except that the reaction is performed at 60° C. for 50 hours instead of the 10 hours.

Synthesis Example 4

Hydrophilic nanocarbon particles are obtained according to the same method as Synthesis Example 1 except that the 28 wt % ammonia water is used in an amount of 50 ml instead of the 120 ml.

Synthesis Example 5

Hydrophilic nanocarbon particles are obtained according to the same method as Synthesis Example 1 except that the 28 wt % ammonia water is used in an amount of 20 ml instead of the 120 ml.

Synthesis Example 6

Hydrophilic nanocarbon particles are obtained according to the same method as Synthesis Example 1 except that the 28 wt % ammonia water is used in an amount of 10 ml instead of the 120 ml.

Synthesis Example 7

1 g of Nanom spectra D100 (Frontier Carbon Corp.) including hydroxyl fullerene ($C_{60}(OH)_{10}$) having in average 10 hydroxy groups as a main component, 200 ml of a 30 wt % hydrogen peroxide solution (Fuji Film Wako Pure Chemical Corp.), and 4 g of triethylamine are put in a 500 ml flask and reacted at 80° C. for 17 hours. After the reaction, 1 L of isopropyl alcohol, 1 L of diethyl ether, and 1 L of hexane are sequentially added thereto to extract a brown precipitate. Subsequently, the precipitate is filtered, washed, and dried under a reduced pressure to obtain hydrophilic nanocarbon particles.

Synthesis Example 8

Hydrophilic nanocarbon particles are obtained according to the same method as Synthesis Example 7 except that the reaction is performed for 17 hours at 25° C. instead of the 80° C.

Synthesis Example 9

1 g of Nanom spectra D100 (Frontier Carbon Corp.) including hydroxyl fullerene ($C_{60}(OH)_{10}$) having in average 10 hydroxy groups as a main component, 11.28 g of 2,2'-azobis[2-(2-imidazolin-2-yl)propane]disulfate dehydrate (Fuji Film Wako Pure Chemical Corp.), and 200 ml of water are put in a 500 ml flask and reacted at 25° C. for 17 hours. After the reaction, the resulting solid product is filtered by using a ceramic film having a diameter of about 1 nm (MWCO 3000, NGK Filtech, Ltd.) and dried under a reduced pressure to obtain hydrophilic nanocarbon particles.

Synthesis Example 10

2 g of Nanom spectra D100 (Frontier Carbon Corp.) including hydroxyl fullerene ($C_{60}(OH)_{10}$) having in average 10 hydroxy groups as a main component, 180 ml of a 30 wt % hydrogen peroxide solution (Fuji Film Wako Pure Chemical Corp.), and 20 ml of 20 wt % tetraethylammonium hydroxide are put in a 500 ml flask and reacted at 70° C. for 17 hours. After the reaction, the resulting solid product is filtered by using a ceramic film having a diameter of about 1 nm (MWCO 3000, NGK Filtech, Ltd.) and dried under a reduced pressure to obtain hydrophilic nanocarbon particles.

Synthesis Example 11

Hydrophilic nanocarbon particles are synthesized according to the same method as Synthesis Example 10 except that tetramethyl ammonium hydroxide is used instead of the tetraethyl ammonium hydroxide.

Synthesis Example 12

1 g of the hydrophilic nanocarbon particles according to Synthesis Example 1, 1 g of iron(III) citrate, and 300 g of water are put in a 500 ml flask and then, reacted at 80° C. for 24 hours. After the reaction, the resulting solid product is filtered by using a ceramic film having a diameter of about 1 nm (MWCO 3000, NGK Filtech, Ltd.) and dried under a reduced pressure to obtain hydrophilic nanocarbon particles.

Comparative Synthesis Example 1

2 g of Nanom spectra D100 (Frontier Carbon Corp.) including hydroxyl fullerene ($C_{60}(OH)_{10}$) having in average 10 hydroxy groups as a main component and 200 ml of a 30 wt % hydrogen peroxide solution (Fuji Film Wako Pure Chemical Corp.) are put in a 500 ml flask and reacted at 60° C. for 14 hours. After the reaction, 1 L of isopropyl alcohol, 1 L of diethylether, and 1 L of hexane are sequentially added thereto to extract a brown precipitate. Subsequently, the precipitate is filtered, washed, and dried under a reduced pressure to obtain hydrophilic nanocarbon particles.

Comparative Synthesis Example 2

Hydrophilic nanocarbon particles are synthesized according to the same method as Synthesis Example 1 except that the 28 wt % ammonia water is used in an amount of 5 ml of instead of the 120 ml.

Evaluation I

Each content of carbon (C), hydrogen (H), and nitrogen (N) in the compounds is element-analyzed according to a method described in "One-Step Synthesis of Water-Soluble Fullerenols bearing Nitrogen-Containing Substituents" Fullerenes, Nanotubes, and Carbon Nanostructures, 2009, in press. Specifically, the C, H, N element automatic analysis is performed by using an automatic element analyzer, 240011 CHNS/O (Perkin Elmer Inc.). Each element (C, H, N) content is measured by analyzing $CO_2$, $H_2O$, and $N_2$ gases generated by combusting a dried solid sample.

A content of Fe is measured by using an atomic absorption spectrometer, AA-6300 (Shimadzu Corp.). Specifically, the dried solid sample is dispersed in water to measure an Fe ion concentration of the aqueous solution.

The element analysis result, a N/C weight ratio, and a Fe/C weight ratio are shown in Table 1.

TABLE 1

| | Elemental Analysis (wt %) | | | | | |
|---|---|---|---|---|---|---|
| | C | H | N | Fe | N/C | Fe/C |
| Synthesis Example 1 | 30.2 | 4.8 | 20.2 | — | 0.669 | — |
| Synthesis Example 2 | 27.6 | 4.4 | 15.5 | — | 0.562 | — |
| Synthesis Example 3 | 29.8 | 4.5 | 15.6 | — | 0.523 | — |
| Synthesis Example 4 | 35.4 | 4.6 | 8.9 | — | 0.251 | — |
| Synthesis Example 5 | 37.4 | 4.3 | 4.6 | — | 0.123 | — |

TABLE 1-continued

| | Elemental Analysis (wt %) | | | | | |
|---|---|---|---|---|---|---|
| | C | H | N | Fe | N/C | Fe/C |
| Synthesis Example 6 | 42.3 | 3.7 | 2.5 | — | 0.06 | — |
| Synthesis Example 7 | 45.3 | 3.8 | 3.2 | — | 0.07 | — |
| Synthesis Example 8 | 51.3 | 3.8 | 4.1 | — | 0.08 | — |
| Synthesis Example 9 | 52.6 | 3.7 | 3.7 | — | 0.07 | — |
| Synthesis Example 10 | 48.4 | 5.0 | 3.9 | — | 0.08 | — |
| Synthesis Example 11 | 46.3 | 4.9 | 3.2 | — | 0.07 | — |
| Synthesis Example 12 | 26.5 | 4.3 | 15.4 | 7.9 | 0.58 | 0.21 |
| Comparative Synthesis Example 1 | 48.1 | 3.6 | — | — | 0 | — |
| Comparative Synthesis Example 2 | 39.6 | 3.8 | 1.2 | — | 0.03 | — |

Evaluation II

A structure of the hydrophilic nanocarbon particles according to synthesis examples is analyzed.

The structure of the hydrophilic nanocarbon particles is analyzed in a method described in "One-Step Synthesis of Water-Soluble Fullerenols bearing Nitrogen-Containing Substituents" Fullerenes, Nanotubes, and Carbon Nanostructures, 2009, in press.

Specifically, (OH), (CO), (COH), (C=C), and (N—H) peaks are confirmed through infrared spectroscopy (IR), and thereby, the structure is expected to be a structure mentioned in the above article, that is, $C_{60}(OH)_\alpha(NH_2)_\beta(NO_2)_\gamma \cdot \delta(H_2O)$.

α: the number of (OH) in one molecule, in general, an integer;

β: the number of ($NH_2$) in one molecule, in general, an integer;

γ: the number of ($NO_2$) in one molecule, in general, an integer; and

δ: the number of ($H_2O$) in one molecule, in general, an integer.

IR is performed by using IR Trace-100 (Shimadzu Corp.), and the automatic element analyzer, 240011 CHNS/O (Perkin Elmer Inc.) is used to analyze an oxygen element (O). In addition, through a thermal gravimetric analysis (TGA), a weight of adsorbed water is measured. TGA is performed by using TA-50 (Shimadzu Corp.).

The aforementioned results are used to determine α, β, γ, and δ.

The results are shown in Table 2.

TABLE 2

| Samples | | (wt %) | | | | (wt %) $H_2O_2$ Content |
|---|---|---|---|---|---|---|
| | | C | H | N | O | |
| Synthesis Example 1 | $C_{60}(OH)_2(NH_2)_{23}(NO_2)_{11} \cdot 33(H_2O)$ | 30.2 | 4.8 | 20.2 | 38.4 | 26.6 |
| Synthesis Example 2 | $C_{60}(OH)_3(NH_2)_{24}(NO_2)_5 \cdot 32(H_2O)$ | 27.6 | 4.4 | 15.5 | 27.4 | 29.4 |
| Synthesis Example 3 | $C_{60}(OH)_3(NH_2)_{24}(NO_2)_3 \cdot 29(H_2O)$ | 29.8 | 4.5 | 15.6 | 25.2 | 30.6 |

Preparation Examples of Polishing Slurry

Preparation Example 1

0.1 weight percent (wt %) of the hydrophilic nanocarbon particles according to Synthesis Example 1, 500 parts per million (ppm) of malonic acid, iron(III) nitrate 9 hydrates (including 30 ppm of Fe), and 400 ppm of pentaethylenehexamine are mixed with water as a balance amount to prepare a polishing slurry.

Preparation Examples 2 to 12

Polishing slurries of Preparation Examples 2 to 12 are prepared according to the same method as Preparation Example 1 except that the hydrophilic nanocarbon particles according to Synthesis Examples 2 to 12 are respectively used, instead of the hydrophilic nanocarbon particles according to Synthesis Example 1.

Comparative Preparation Example 1

A polishing slurry is prepared according to the same method as Preparation Example 1 except that the hydrophilic nanocarbon particles of Comparative Synthesis Example 1 is used instead of the hydrophilic nanocarbon particles of Synthesis Example 1.

Comparative Preparation Example 2

A polishing slurry is prepared according to the same method as Preparation Example 1 except that the hydrophilic nanocarbon particles of Comparative Synthesis Example 2 is used instead of the hydrophilic nanocarbon particles of Synthesis Example 1.

Comparative Preparation Example 3

A polishing slurry is prepared according to the same method as Preparation Example 1 except that colloid silica having an average particle size of 50 nanometers (nm) is used instead of the hydrophilic nanocarbon particles of Synthesis Example 1.

Evaluation III

In order to measure a polishing rate (a material removal rate: MRR), a 20 millimeter×20 millimeter (20 mm×20 mm) tungsten specimen is prepared. In order to measure over etching (recess/erosion), a 20 mm×20 mm pattern specimen is prepared. In this specimen, a 0.20 micrometer (μm) wide tungsten line and a 0.20 μm wide silicon oxide spacer are alternately disposed.

The specimen is polished under the following condition.

Polishing Device: MA-200e (Musashino Denshi Co., Ltd.)

Polished Object (wafer):

(1) A wafer for calculating the polishing rate: a 20 mm×20 mm wafer prepared by forming a 1.5 μm-thick tungsten (W) film on a silicon substrate (2) Specimens for measuring over-etching (Recess and Erosion): Pattern specimens of 20 mm×20 mm are prepared. These specimens consist of silicon oxide spacer lines having a 0.20 μm-wide tungsten line and 0.20 μm-wide spacings between tungsten lines.

(3) A polishing pad: IC1000 (The Dow Chemical Company)
(4) The number of spinning a polishing plate: 90 revolutions per minute (rpm)
(5) The number of spinning a polishing pad: 90 rpm
(6) A method of supplying a polishing solution: putting 200 ml of a polishing slurry on the polishing pad.
(7) A polishing pressure: 14 kiloPascal (kPa)
(8) A polishing temperature: 25° C.

The polishing rate angstroms per minute (Å/min) is obtained by performing polishing for 2 minutes, converting electrical resistance measurements into thicknesses of the tungsten (VV) film before and after the polishing, and using them for conversion into a rate.

The results are shown in Table 3.

TABLE 3

| | Polishing rate (Å/min) | Recess (Å) | Erosion (Å) |
|---|---|---|---|
| Preparation Example 1 | 230 | 52 | <20 |
| Preparation Example 2 | 290 | 56 | <20 |
| Preparation Example 3 | 220 | 49 | <20 |
| Preparation Example 4 | 150 | 46 | <20 |
| Preparation Example 5 | 110 | 41 | <20 |
| Preparation Example 6 | 90 | 42 | <20 |
| Preparation Example 7 | 80 | 40 | <20 |
| Preparation Example 8 | 90 | 38 | <20 |
| Preparation Example 9 | 80 | 36 | <20 |
| Preparation Example 10 | 80 | 35 | <20 |
| Preparation Example 11 | 170 | 37 | <20 |
| Preparation Example 12 | 270 | 48 | <20 |
| Comparative Preparation Example 1 | 40 | 32 | <20 |
| Comparative Preparation Example 2 | 50 | 32 | <20 |
| Comparative Preparation Example 3 | 290 | 65 | 250 |

Referring to Table 3, when the polishing slurry according to Preparation Examples 1 to 12 is used to polish the tungsten (VV) film, a high polishing rate with a small damage and shape deformation of the structure is obtained. Preparation Examples 1 to 5 and 11 and 12 exhibit relatively efficient removal rates with little damage or shape deformation.

Evaluation IV

The material removal rate (MRR) is evaluated by performing polishing under the following condition.
Polishing Device: POLY-762 (G&P Technology, Inc.)
Polished Object (wafer):
(1) A wafer for calculating the polishing rate: a 12-inch diameter wafer prepared by forming a 1.5 μm-thick tungsten (VV) film on a silicon substrate. This specimen has a silicon oxide spacer line consisting of a 0.20 μm-wide tungsten line and a 0.20 μm-wide space between the tungsten lines.
(3) A polishing pad: 101000 (The Dow Chemical Company)
(4) The number of spinning a polishing plate: 93 rpm
(5) The number of spinning the polishing pad: 87 rpm
(6) A method of supplying a polishing solution: a slurry is continuously input on the polishing pad.
(7) A polishing pressure: 14 kPa
(8) A polishing temperature: 50° C.

The MRR is calculated by performing polishing for 2 minutes, converting electrical resistance measurements into thicknesses of the tungsten (VV) film before and after the polishing, and using them for conversion into a rate.

The results are shown in Table 4.

TABLE 4

| | MRR (Å/min) | Recess (Å) | Erosion (Å) |
|---|---|---|---|
| Preparation Example 1 | 2850 | 75 | <20 |
| Preparation Example 2 | 3710 | 78 | <20 |
| Preparation Example 3 | 2840 | 67 | <20 |
| Preparation Example 4 | 1930 | 59 | <20 |
| Preparation Example 5 | 1470 | 59 | <20 |
| Preparation Example 6 | 1060 | 56 | <20 |
| Preparation Example 12 | 3480 | 67 | <20 |
| Comparative Preparation Example 3 | 3810 | 109 | 270 |

Referring to Table 4, when the polishing slurry of Preparation Example is used to polish a large area of the tungsten (VV) film, a high polishing rate with a small damage and shape deformation of the structure may be obtained. Preparation Examples 1 to 4 and 12 exhibit relatively efficient removal rates with little damage or shape deformation.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A polishing slurry comprising a nanocarbon particle having a nitrogen-containing functional group,
   wherein a weight ratio of a nitrogen element relative to a carbon element of the hydrophilic nanocarbon particle expressed as N/C×100% is greater than or equal to about 5 wt %.

2. The polishing slurry of claim 1, wherein the weight ratio of a nitrogen element relative to a carbon element of the nanocarbon particle is about 5 wt % to about 80 wt %.

3. The polishing slurry of claim 1, wherein the nitrogen-containing functional group is derived from at least one of ammonia, an ammonium salt, an amine compound, a polyamine compound, a nitro compound, an azo compound, hydroxides of each thereof, or hydrates of each thereof.

4. The polishing slurry of claim 1, wherein the nitrogen-containing functional group comprises at least one of an amino group, a nitro group, a secondary amine group, a tertiary amine group, a quaternary amine group, a diamine group, a polyamine group, an azo group, or an amide group.

5. The polishing slurry of claim 1, wherein the nanocarbon particle comprises at least one of fullerene, graphene, graphite, a carbon nanotube, or a carbon dot, each of which including at least one hydrophilic functional group.

6. The polishing slurry of claim 5, wherein the hydrophilic functional group comprises at least one of a hydroxyl group, a carbonyl group, a carboxyl group, a sulfhydryl group, or a phosphate group.

7. The polishing slurry of claim 1, wherein the nanocarbon particle has at least one hydrophilic functional group, and
   the nanocarbon particle comprises on average 12 to 44 of the hydrophilic functional groups and the nitrogen-containing functional groups.

8. The polishing slurry of claim 7, wherein the nitrogen-containing functional groups exist in a greater number of groups than the hydrophilic functional group.

9. The polishing slurry of claim 1, further comprising a metal ion chemically fixed on a surface of the nanocarbon particle.

10. The polishing slurry of claim 9, wherein the metal ion is derived from a soluble metal compound.

11. The polishing slurry of claim 1, wherein the nanocarbon particle comprises hydroxyl fullerene.

12. A polishing slurry comprising a nanocarbon particle on which an oxidation catalyst is chemically fixed.

13. The polishing slurry of claim 12, wherein the oxidation catalyst comprises a nitrogen-containing oxidation catalyst.

14. The polishing slurry of claim 13, wherein the nitrogen-containing oxidation catalyst is derived from at least one of ammonia, an ammonium salt, an amine compound, a polyamine compound, a nitro compound, an azo compound, hydroxides of each thereof, or hydrates of each thereof.

15. The polishing slurry of claim 13, wherein the nitrogen-containing oxidation catalyst comprises at least one of an amino group, a nitro group, a secondary amine group, a tertiary amine group, a quaternary amine group, a diamine group, a polyamine group, an azo group, or an amide group.

16. The polishing slurry of claim 13, wherein the oxidation catalyst further comprises a metal-containing oxidation catalyst.

17. The polishing slurry of claim 12, wherein the nanocarbon particle comprises at least one of fullerene, graphene, graphite, a carbon nanotube, or a carbon dot, each of which including at least one hydrophilic functional group.

18. The polishing slurry of claim 13, wherein the hydrophilic functional group comprises at least one of a hydroxyl group, a carbonyl group, a carboxyl group, a sulfhydryl group, or a phosphate group.

19. The polishing slurry of claim 12, wherein the nanocarbon particle has at least one hydrophilic functional group, and the nanocarbon particle comprises on average 12 to 44 of the hydrophilic functional groups and the nitrogen-containing functional groups.

20. The polishing slurry of claim 19, wherein the oxidation catalyst exists on average in a greater number than the hydrophilic functional group.

* * * * *